US008198155B2

(12) United States Patent
Ikeno et al.

(10) Patent No.: US 8,198,155 B2
(45) Date of Patent: Jun. 12, 2012

(54) SEMICONDUCTOR DEVICE AND METHOD OF MANUFACTURING THE SAME

(75) Inventors: Daisuke Ikeno, Yokohama (JP); Tomonori Aoyama, Yokohama (JP); Kazuaki Nakajima, Tokyo (JP); Seiji Inumiya, Carmel, NY (US); Takashi Shimizu, Yokohama (JP); Takuya Kobayashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 215 days.

(21) Appl. No.: 12/693,985

(22) Filed: Jan. 26, 2010

(65) Prior Publication Data

US 2010/0187612 A1     Jul. 29, 2010

(30) Foreign Application Priority Data

Jan. 27, 2009 (JP) .................................. 2009-15132

(51) Int. Cl.
  *H01L 21/8234* (2006.01)
  *H01L 21/8238* (2006.01)
  *H01L 29/51* (2006.01)
(52) U.S. Cl. ................ 438/223; 257/412; 257/E21.625; 257/E21.639
(58) Field of Classification Search .................... None
  See application file for complete search history.

(56) References Cited

U.S. PATENT DOCUMENTS

| 7,432,567 | B2 * | 10/2008 | Doris et al. ............... | 257/407 |
| 7,541,657 | B2 * | 6/2009 | Koyama et al. ............ | 257/407 |
| 7,595,538 | B2 * | 9/2009 | Yamamoto ................. | 257/410 |
| 7,666,732 | B2 * | 2/2010 | Doris et al. ............... | 438/205 |
| 7,820,552 | B2 * | 10/2010 | Kanakasabapathy et al. ..................... | 438/704 |
| 7,855,134 | B2 * | 12/2010 | Sakashita et al. ............ | 438/592 |
| 2006/0131652 | A1 * | 6/2006 | Li ......................... | 257/350 |

(Continued)

FOREIGN PATENT DOCUMENTS

JP     2007-088122     4/2007

(Continued)

OTHER PUBLICATIONS

Gusev, E. P. "Ultrathin High-k Gate Stacks for Advanced CMOS Devices." IEEE. IEDM 01.451 (2001).*

(Continued)

*Primary Examiner* — Thomas L Dickey
*Assistant Examiner* — Joseph Schoenholtz
(74) *Attorney, Agent, or Firm* — Finnegan, Henderson, Farabow, Garrett & Dunner, L.L.P.

(57) ABSTRACT

A semiconductor device according to an embodiment of the present invention includes an N-type transistor formed in a first region on a substrate, and a P-type transistor formed in a second region on the substrate. The device includes the substrate, a first gate insulation film formed on the substrate in the first and second regions, and containing silicon, a second gate insulation film formed on the first gate insulation film in the first region, and containing first metal and oxygen, a third gate insulation film formed on the first gate insulation film in the second region, and containing second metal different from the first metal and oxygen, a fourth gate insulation film formed on the second and third gate insulation films in the first and second regions, and containing hafnium, and a gate electrode layer formed on the fourth gate insulation film in the first and second regions, and containing metal and nitrogen, a thickness of the gate electrode layer formed in the second region being greater than a thickness of the gate electrode layer formed in the first region.

15 Claims, 14 Drawing Sheets

U.S. PATENT DOCUMENTS

| | | | |
|---|---|---|---|
| 2006/0270239 A1* | 11/2006 | Triyoso et al. | 438/706 |
| 2007/0178634 A1* | 8/2007 | Jung et al. | 438/199 |
| 2008/0017936 A1* | 1/2008 | Buchanan et al. | 257/411 |
| 2008/0070395 A1* | 3/2008 | Yen et al. | 438/591 |
| 2008/0191292 A1* | 8/2008 | Callegari et al. | 257/411 |
| 2008/0224238 A1* | 9/2008 | Kanakasabapathy et al. | 257/411 |
| 2008/0258198 A1* | 10/2008 | Bojarczuk et al. | 257/314 |
| 2009/0008720 A1* | 1/2009 | Doris et al. | 257/369 |
| 2009/0008725 A1* | 1/2009 | Guha et al. | 257/411 |

FOREIGN PATENT DOCUMENTS

| | | |
|---|---|---|
| JP | 2007-243009 | 9/2007 |
| JP | 2007-283208 | 11/2007 |

OTHER PUBLICATIONS

Huff, H. "High-k Gate Stacks for Planar, Scaled CMOS Integrated Circuits." Microelectronic Engineering 69.2-4 (2003): 152-67.*

Kawamura, M. "Characterization of TiN Films Prepared by a Conventional Magnetron Sputtering System: Influence of Nitrogen Flow Percentage and Electrical Properties." Thin Solid Films 287.1-2 (1996): 115-19.*

Liao, J. C., Y. K. Fang, C. H. Chen, Y. T. Hou, P. F. Hsu, K. C. Lin, K. T. Huang, T. L. Lee, and M. S. Liang. "The Influence of Nitrogen Incorporation on Performance and Bias Temperature Instability of Metal Oxide Semiconductor Field Effect Transistors with Ultrathin High-k Gate Stacks." Applied Physics Letters 93.19 (2008): 193506.*

Locquet, Jean-Pierre, Chiara Marchiori, Maryline Sousa, Jean Fompeyrine, and Jin Won Seo. "High-K Dielectrics for the Gate Stack." Journal of Applied Physics 100.5 (2006): 051610.*

Penilla, E., and J. Wang. "Pressure and Temperature Effects on Stoichiometry and Microstructure of Nitrogen-Rich TiN Thin Films Synthesized via Reactive Magnetron DC-Sputtering." Journal of Nanomaterials 2008 (2008).*

Wu, L. "Investigation of ALD or PVD (Ti-rich vs. N-Rich) TiN Metal Gate Thermal Stability on HfO2 High-k." IEEE (2010): 90-91.*

Ikeno et al.; "Semiconductor Device and Method for Manufacturing the Same", U.S. Appl. No. 12/683,050, filed Jan. 6, 2010.

* cited by examiner

SEMICONDUCTOR DEVICE AND METHOD OF MANUFACTURING THE SAME

CROSS REFERENCE TO RELATED APPLICATION

This application is based upon and claims the benefit of priority from the prior Japanese Patent Application No. 2009-15132, filed on Jan. 27, 2009, the entire contents of which are incorporated herein by reference.

BACKGROUND OF THE INVENTION

1. Field of the Invention

The present invention relates to a semiconductor device and a method of manufacturing the same, for example, for a CMOSFET (Complementary Metal Oxide Semiconductor Field Effect Transistor) including a metal gate electrode and a high-k insulation film (high permittivity insulation film).

2. Background Art

Due to a miniaturization of an LSI (Large Scale Integrated circuit), a gate insulation film is required to be thinner than ever. In a CMOS of a 32 nm or smaller node, the gate insulation film is required to have a performance of 0.9 nm or smaller thickness in equivalent oxide thickness. However, in a polysilicon electrode that has been conventionally used as a gate electrode, depletion is caused in the electrode due to its semiconductor characteristics. This increases the effective thickness of the gate insulation film by approximately 0.3 nm, and hinders a reduction of the thickness of the gate insulation film.

To prevent depletion in the gate electrode, there is a demand for an introduction of a metal gate electrode. The metal gate electrode is required to have an effective work function (EWF) near an Si band edge, to reduce the threshold voltage (Vth) of a transistor. More specifically, an NMOSFET (N-channel MOSFET) is required to have an EWF near the Si conduction band edge (4.05 eV), and a PMOSFET (P-channel MOSFET) is required to have an EWF near the Si valence band edge (5.17 eV). By giving the EWF near the Si band edge to the metal gate electrode, the threshold voltage Vth can be lowered, and the CMOS having a desired driving force can be obtained.

Metal nitride is widely considered today as a candidate for a metal gate electrode material, since the metal nitride is thermally stable and is easily etched to form a gate. However, the metal nitride is known to have an EWF near the midgap (approximately 4.6 eV) of the Si bandgap, so that the threshold voltage Vth cannot be reduced simply by employing the metal nitride.

Therefore, where the metal nitride is employed, the threshold voltage Vth is reduced by using an $La_2O_3$ (lanthanum oxide) film in the NMOS, or an SiGe (silicon germanium) layer and an $Al_2O_3$ (aluminum oxide) film in the PMOS (see JP-A 2007-283208 (KOKAI), for example). In such a case, the $La_2O_3$ film is formed between the Si substrate and the metal nitride, to cause an approximately 0.5 eV decrease in the EFW. Also, the SiGe layer is formed in the channel region, and the $Al_2O_3$ film is formed between the Si substrate and the metal nitride, to cause an approximately 0.5 eV increase in the EWF. Accordingly, the threshold voltage Vth can be reduced by combining this technique and the metal nitride electrode.

However, when the metal nitride electrode is actually formed on a high-k insulation film, the EWF of the metal nitride electrode becomes approximately 0.2 eV lower than the midgap, due to the high temperature heating processes performed during the manufacture. In such a case, even if the channel SiGe layer and the $Al_2O_3$ film are used in the PMOS, an EWF near the Si valence band edge cannot be obtained, and a desired decrease of the threshold voltage Vth cannot be achieved.

Each of JP-A 2007-88122 (KOKAI) and JP-A 2007-243009 (KOKAI) discloses an example of a transistor having a high-k insulation film and a metal gate electrode. More specifically, JP-A 2007-88122 (KOKAI) discloses a p-channel field effect transistor including a high-k insulation film containing hafnium or zirconium, and a titanium nitride film. JP-A 2007-243009 (KOKAI) discloses a p-channel MISFET including a hafnium oxide film, an aluminum oxide film, and a titanium nitride film.

SUMMARY OF THE INVENTION

An aspect of the present invention is, for example, a method of manufacturing a semiconductor device, for forming an N-type transistor in a first region on a substrate, and forming a P-type transistor in a second region on the substrate, the method including forming a first gate insulation film containing silicon, on the substrate in the first and second regions, forming a second gate insulation film containing first metal and oxygen, on the first gate insulation film in the first region, forming a third gate insulation film containing second metal different from the first metal and oxygen, on the first gate insulation film in the second region, forming a fourth gate insulation film containing hafnium, on the second and third gate insulation films in the first and second regions, depositing a first conductive film containing metal and nitrogen, on the fourth gate insulation film in the first and second regions, removing the first conductive film on the fourth gate insulation film in the first region, depositing a second conductive film containing metal and nitrogen, on the fourth gate insulation film and the first conductive film in the first and second regions, introducing excess nitrogen from the first and second conductive films into the fourth gate insulation film, and etching the first and second conductive films in the first and second regions to form a gate electrode for the N-type transistor including the second conductive film, and a gate electrode for the P-type transistor including the first and second conductive films.

Another aspect of the present invention is, for example, a method of manufacturing a semiconductor device, for forming an N-type transistor in a first region on a substrate, and forming a P-type transistor in a second region on the substrate, the method including forming a first gate insulation film containing silicon, on the substrate in the first and second regions, forming a second gate insulation film containing first metal and oxygen, on the first gate insulation film in the first region, forming a third gate insulation film containing second metal different from the first metal and oxygen, on the first gate insulation film in the second region, forming a fourth gate insulation film containing hafnium, on the second and third gate insulation films in the first and second regions, depositing a gate electrode layer containing metal and nitrogen, on the fourth gate insulation film in the first and second regions, etching the gate electrode layer in the first region to make a thickness of the gate electrode layer in the second region be greater than a thickness of the gate electrode layer in the first region, introducing excess nitrogen from the gate electrode layer into the fourth gate insulation film, and etching the gate electrode layer in the first and second regions to form a gate electrode for the N-type transistor including the gate electrode layer, and a gate electrode for the P-type transistor including the gate electrode layer.

Another aspect of the present invention is, for example, a semiconductor device including an N-type transistor formed in a first region on a substrate, and a P-type transistor formed in a second region on the substrate, the device including the substrate, a first gate insulation film formed on the substrate in the first and second regions, and containing silicon, a second gate insulation film formed on the first gate insulation film in the first region, and containing first metal and oxygen, a third gate insulation film formed on the first gate insulation film in the second region, and containing second metal different from the first metal and oxygen, a fourth gate insulation film formed on the second and third gate insulation films in the first and second regions, and containing hafnium, and a gate electrode layer formed on the fourth gate insulation film in the first and second regions, and containing metal and nitrogen, a thickness of the gate electrode layer formed in the second region being greater than a thickness of the gate electrode layer formed in the first region.

DESCRIPTION OF THE EMBODIMENTS

The following is a description of the embodiments of the present invention, with reference to the accompanying drawings.

First Embodiment

Figure 1:
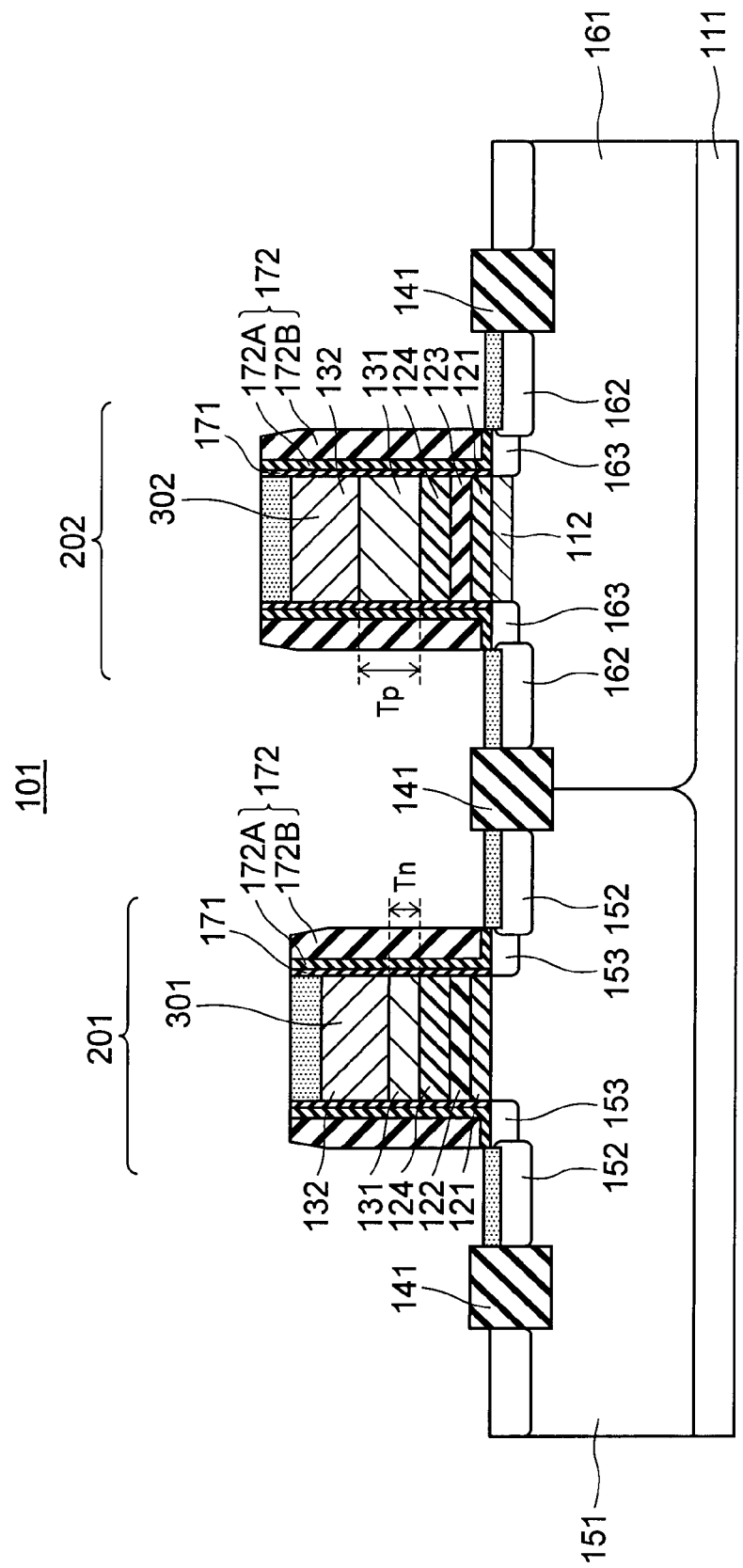
FIG. 1 is a side sectional view of a semiconductor device according to a first embodiment.

FIG. 1 is a side sectional view of a semiconductor device 101 according to a first embodiment.

The semiconductor device 101 of FIG. 1 includes an NMOSFET 301 formed in an NMOS region 201 on a substrate 111, and a PMOSFET 302 formed in a PMOS region 202 on the substrate 111. The NMOS region 201 and the PMOS region 202 are examples of first and second regions of the invention, respectively. The NMOSFET 301 and the PMOSFET 302 are examples of N-type and P-type transistors of the invention, respectively.

The semiconductor device 101 of FIG. 1 includes, as components of the NMOSFET 301 and the PMOSFET 302, the substrate 111, a channel SiGe (silicon germanium) layer 112, an $SiO_2$ (silicon oxide) film 121 as an example of a first gate insulation film, an $La_2O_3$ (lanthanum oxide) film 122 as an example of a second gate insulation film, an $Al_2O_3$ (aluminum oxide) film 123 as an example of a third gate insulation film, an HfSiON (hafnium silicon oxynitride) film 124 as an example of a fourth gate insulation film, a TiN (titanium nitride) film 131 as an example of a gate electrode layer (first gate electrode layer), and a polysilicon (Poly-Si) film 132 as an example of the gate electrode layer (second gate electrode layer).

The substrate 111 in this embodiment is a semiconductor substrate, more specifically, a silicon substrate. The substrate 111 may be an SOI (Silicon On Insulator) substrate. The substrate 111 is provided with isolation layers 141 of STI structures, a P-type diffusion layer 151, and an N-type diffusion layer 161. The NMOSFET 301 and the PMOSFET 302 are formed on the P-type diffusion layer 151 and the N-type diffusion layer 161, respectively. N-type source and drain diffusion layers 152 and N-type extension diffusion layers 153 are formed on the surface of the P-type diffusion layer 151, and P-type source and drain diffusion layers 162 and P-type extension diffusion layers 163 are formed on the surface of the N-type diffusion layer 161.

The channel SiGe layer 112 is an epitaxial semiconductor layer containing Si (silicon) and Ge (germanium), and is formed on the surface of the substrate 111 in the PMOS region 202.

The $SiO_2$ film(s) 121 is an oxide film containing Si (silicon), and is formed on the substrate 111 in the NMOS region 201 and the PMOS region 202. The $SiO_2$ film 121 in the NMOS region 201 is formed directly on the substrate 111, and the $SiO_2$ film 121 in the PMOS region 202 is formed on the substrate 111 via the channel SiGe layer 112. In this embodiment, some other insulation film containing Si may be used as the first gate insulation film.

The $La_2O_3$ film 122 is an oxide film containing La (lanthanum), and is formed on the $SiO_2$ film 121 in the NMOS region 201. The La in the $La_2O_3$ film 122 is an example of the first metal of the invention.

The $Al_2O_3$ film 123 is an oxide film containing Al (aluminum), and is formed on the $SiO_2$ film 121 in the PMOS region 202. The Al in the $Al_2O_3$ film 123 is an example of the second metal of the invention.

The HfSiON film(s) 124 is a silicon oxynitride film containing Hf (hafnium), and is formed on the $La_2O_3$ film 122 and $Al_2O_3$ film 123 in the NMOS region 201 and the PMOS region 202. The HfSiON film 124 is a high-k insulation film. In this embodiment, some other insulation film containing Hf may be used as the fourth gate insulation film.

The TiN film(s) 131 is a metal nitride film containing Ti (titanium) and N (nitrogen), and is formed on the HfSiON film 124 in the NMOS region 201 and the PMOS region 202. In this embodiment, the thickness (Tp) of the TiN film 131 formed in the PMOS region 202 is greater than the thickness (Tn) of the TiN film 131 formed in the NMOS region 201, as shown in FIG. 1. The thicknesses of the TiN films 131 will be described later in detail. In this embodiment, some other metal nitride film may be used as the gate electrode layer (the first gate electrode layer). Examples of such metal nitride films include a TaN (tantalum nitride) film, a WN (tungsten nitride) film, and an MoN (molybdenum nitride) film.

The polysilicon film(s) 132 is made of polycrystalline silicon, and is formed on the TiN film 131 in the NMOS region 201 and the PMOS region 202. The polysilicon film 132 may be partially silicided, or may be fully silicided.

In the semiconductor device 101 of FIG. 1, the TiN 131 and the polysilicon film 132 in the NMOS region 201 form a gate electrode for the NMOSFET 301, and the TiN 131 and the polysilicon film 132 in the PMOS region 202 form a gate electrode for the PMOSFET 302.

The semiconductor device 101 of FIG. 1 further includes offset spacers 171 and sidewall spacers 172. The offset spacers 171 are formed on sidewalls of the NMOSFET 301 and the PMOSFET 302. The offset spacers 171 are silicon oxide films or silicon nitride films in this embodiment. The sidewall spacers 172 are formed on the sidewalls of the NMOSFET 301 and the PMOSFET 302 via the offset spacers 171. Each of the sidewall spacers 172 is a stack layer including a silicon oxide film (172A) and a silicon nitride film (172B) in this embodiment.

As described above, each of the NMOSFET 301 and the PMOSFET 302 of FIG. 1 includes the TiN film 131 that is a metal nitride film, as the metal gate electrode. The Metal nitride is known to have an effective work function (EWF) near the midgap (approximately 4.6 eV) of the Si bandgap.

Further, the NMOSFET 301 of FIG. 1 has the $La_2O_3$ film 122, and the PMOSFET 302 of FIG. 1 has the $Al_2O_3$ film 123 and the channel SiGe layer 112. The $La_2O_3$ film 122 can reduce the EWF by approximately 0.5 eV, and the $Al_2O_3$ film 123 and the channel SiGe layer 112 can increase the EWF by approximately 0.5 eV.

With the above structure, the metal gate electrode for the NMOSFET 301 can normally have an EWF near the Si conduction band edge (4.05 eV), and the metal gate electrode for the PMOSFET 302 can normally have an EWF near the Si valence band edge (5.17 eV). However, a metal nitride electrode on a high-k insulation film has a problem that the EWF becomes approximately 0.2 eV lower than the midgap, due to the high-temperature heating processes performed during the manufacture.

To counter this problem, the thickness (Tp) of the TiN film 131 formed in the PMOS region 202 is made greater than the thickness (Tn) of the TiN film 131 formed in the NMOS region 201 in this embodiment.

In the following, the thicknesses of the TiN film 131 are described in detail.

Figure 2:
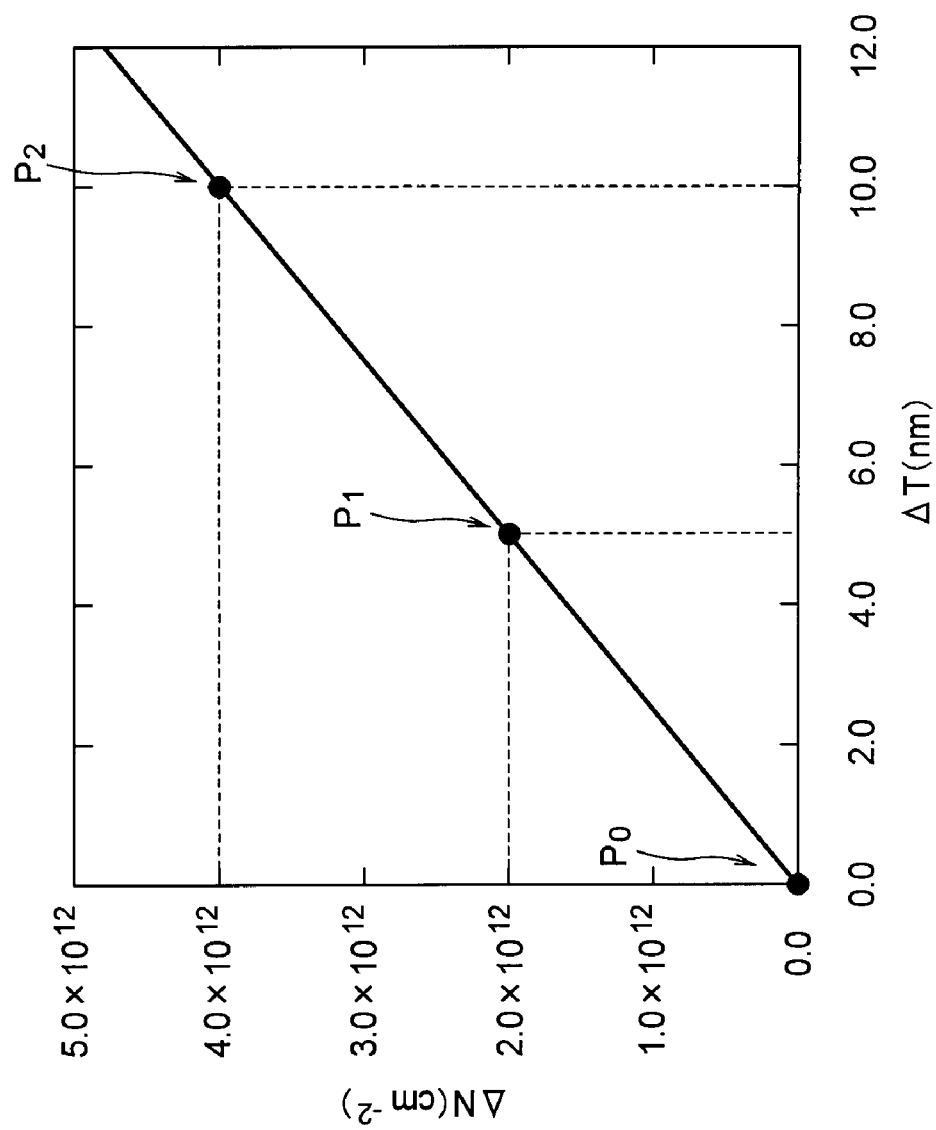
FIG. 2 is a graph showing the relationship between the thickness difference and the density difference, with respect to the thickness of a TiN film and the area density of excess nitrogen in the TiN film.

FIG. 2 is a graph showing the relationship between the thickness difference and the density difference, with respect to the thickness of the TiN film 131 and the area density of excess nitrogen in the TiN film 131.

The abscissa axis $\Delta T$ represents the thickness difference between the thickness (Tp) of the TiN film 131 formed in the PMOS region 202 and the thickness (Tn) of the TiN film 131 formed in the NMOS region 201. Accordingly, $\Delta T$ is Tp−Tn. Here, the abscissa axis $\Delta T$ is shown in nm.

The ordinate axis $\Delta N$ represents the density difference between the area density (Np) of the excess nitrogen in the TiN film 131 formed in the PMOS region 202 and the area density (Nn) of the excess nitrogen in the TiN film 131 formed in the NMOS region 201. Accordingly, $\Delta N$ is Np−Nn. Here, the ordinate axis $\Delta N$ is shown in $cm^{-2}$.

In this embodiment, the volume density ($cm^{-3}$) of the excess nitrogen in the TiN film 131 is uniform. Accordingly, the density difference $\Delta N$ in the area density of excess nitrogen is proportional to the thickness difference $\Delta T$. In FIG. 2, the composition ratio between Ti and N in the TiN film 131 is set as Ti:N=4:6.

The excess nitrogen in the TiN film 131 diffuses into the HfSiON film 124 during various heating processes in the manufacture. According to the knowledge of the inventors, the EWF of the TiN 131 increases, since the excess nitrogen in the TiN film 131 diffuses into the HfSiON film 124. Further, if the amount of excess nitrogen diffusing into the HfSiON film 124 in the PMOS region 202 is larger than the amount of excess nitrogen diffusing into the HfSiON film 124 in the NMOS region 201, the EWF in the PMOSFET 302 becomes higher than the EWF in the NMOSFET 301. This embodiment takes advantage of this phenomenon to counter the above mentioned problem of EWF decrease.

As indicated by the point $P_1$ in FIG. 2, the density difference $\Delta N$ in the area density of excess nitrogen is $2 \times 10^{12} cm^{-2}$, when the thickness difference $\Delta T$ is 5 nm. In this case, when all the excess nitrogen in the TiN film 131 diffuses into the HfSiON film 124, the EWF in the PMOSFET 302 becomes 0.2 eV higher than the EWF in the NMOSFET 301 in calculation. Accordingly, in a case where the TiN film 131 has the composition ratio of Ti:N=4:6, if the thickness difference $\Delta T$ is made 5 nm, the EWF of the midgap (4.6 eV) can be realized in the PMOSFET 302.

Where the TiN film 131 has a composition ratio different from 4:6, the proportionality constant between the thickness difference $\Delta T$ and the density difference $\Delta N$ differs from that shown in FIG. 2. However, the EWF of the midgap (4.6 eV) can also be realized in the PMOSFET 302 by making the thickness difference $\Delta T$ be a predetermined value in this case.

As described above, in this embodiment, the thickness of the TiN film 131 in the PMOS region 202 is made greater than the thickness of the TiN film 131 in the NMOS region 201. With this arrangement, the EWF of the midgap (4.6 eV) can be realized in the PMOSFET 302 in this embodiment. More specifically, according to this embodiment, the EWF of the TiN film 131 in the PMOS region 202 can be made equal to or greater than 4.6 eV at the time of deposition of the TiN film 131. As a result, the EWF of the TiN film 131 in the PMOS region 202 can approximate the 4.6 eV when the semiconductor device 101 is completed.

Furthermore, in the NMOSFET 301 of this embodiment, the $La_2O_3$ film 122 is formed between the $SiO_2$ film 121 and the HfSiON film 124. Accordingly, the metal gate electrode for the NMOSFET 301 can have an EWF near the Si conduction band edge (4.05 eV), and the threshold voltage of the NMOSFET 301 can be made low enough in this embodiment.

Furthermore, in the PMOSFET 302 of this embodiment, the $Al_2O_3$ film 123 is formed between the $SiO_2$ film 121 and the HfSiON film 124, and the channel SiGe layer 112 is formed on the surface of the substrate 111. Accordingly, the metal gate electrode for the PMOSFET 302 can have an EWF near the Si valence band edge (5.17 eV), and the threshold voltage of the PMOSFET 302 can be made low enough in this embodiment.

As described above, the thickness of the TiN film 131 in the PMOS region 202 is made greater than the thickness of the TiN film 131 in the NMOS region 201, and the $La_2O_3$ film 122, the $Al_2O_3$ film 123, and the channel SiGe layer 122 are provided in this embodiment. With this arrangement, the threshold voltages of the NMOSFET 301 and the PMOSFET 302 can be made low enough. Accordingly, the excellent NMOSFET 301 and the excellent PMOSFET 302 can be formed, so that a high-performance CMOSFET can be realized in this embodiment.

The excess nitrogen diffusing into the HFSiON film 124 may be regarded as negative charges that are arranged in a sheet-like manner between the substrate 111 and the TiN film 131. In this case, the density difference $\Delta N$ in the area density of the excess nitrogen is set between $1 \times 10^{12} cm^{-2}$ and $5 \times 10^{12} cm^{-2}$, so that the EWF in the PMOSFET 302 can be made higher than the EWF in the NMOSFET 301 by 0.1 to 0.5 eV. According to the findings of the inventors, in most cases, the EWFs can be lowered by setting the EWF difference between 0.1 eV and 0.5 eV. Therefore, it is desirable that the density difference $\Delta N$ in the area density of the excess nitrogen is set between $1 \times 10^{12} cm^{-2}$ and $5 \times 10^{12} cm^{-2}$.

In this embodiment, the TiN film is used as the metal gate electrodes. However, it is possible to use other metal nitride film such as a TaN film, a WN film, or an MoN film as the metal gate electrodes. In such cases, the relationship between $\Delta T$ and $\Delta N$ differs from that shown in FIG. 2, depending on the type of film and composition. However, in most metal nitride films, an EWF difference of 0.1 to 0.5 eV can be realized by setting $\Delta N$ between $1\times10^{12}$ cm$^{-2}$ and $5\times10^{12}$ cm$^{-2}$.

As described above with reference to FIG. 2, it is assumed that all the excess nitrogen in the TiN film 131 diffuses into the HfSiON film 124. However, not all the excess nitrogen might diffuse into the HfSiON film 124. In each of the NMOS region 201 and the PMOS region 202, the amount of excess nitrogen diffusing into the HfSiON film 124 increases with the thickness of the TiN film 131. Therefore, the above described phenomenon can be observed even if not all the excess nitrogen diffuses. In a case where the diffusion amount of excess nitrogen is small, $\Delta N$ might be set between $1\times10^{12}$ cm$^{-2}$ and $1\times10^{13}$ cm$^{-2}$.

The thickness difference $\Delta T$ may not be 5 nm. For example, it is preferable that the thickness difference $\Delta T$ is 2 nm or greater. The reason for this is that it is difficult to set 2 nm or less to the thickness difference based on the current manufacturing technique. In addition, for example, it is preferable that the thickness difference $\Delta T$ is 10 nm or less. The reason for this is that, if the thickness difference is made greater than 10 nm, it is difficult to perform gate RIE on the NMOS region 201 and the PMOS 202 at the same time. Therefore, it is desirable that the thickness difference $\Delta T$ is in the range of 2 nm to 10 nm. To obtain a preferred density difference $\Delta N$, the thickness difference $\Delta T$ should be set at such a value that a density difference $\Delta N$ between $1\times10^{12}$ cm$^{-2}$ and $1\times10^{13}$ cm$^{-2}$ can be obtained.

FIGS. 3 to 10 are schematic views illustrating procedures according to a method of manufacturing the semiconductor device 101 of FIG. 1.

Figure 3:
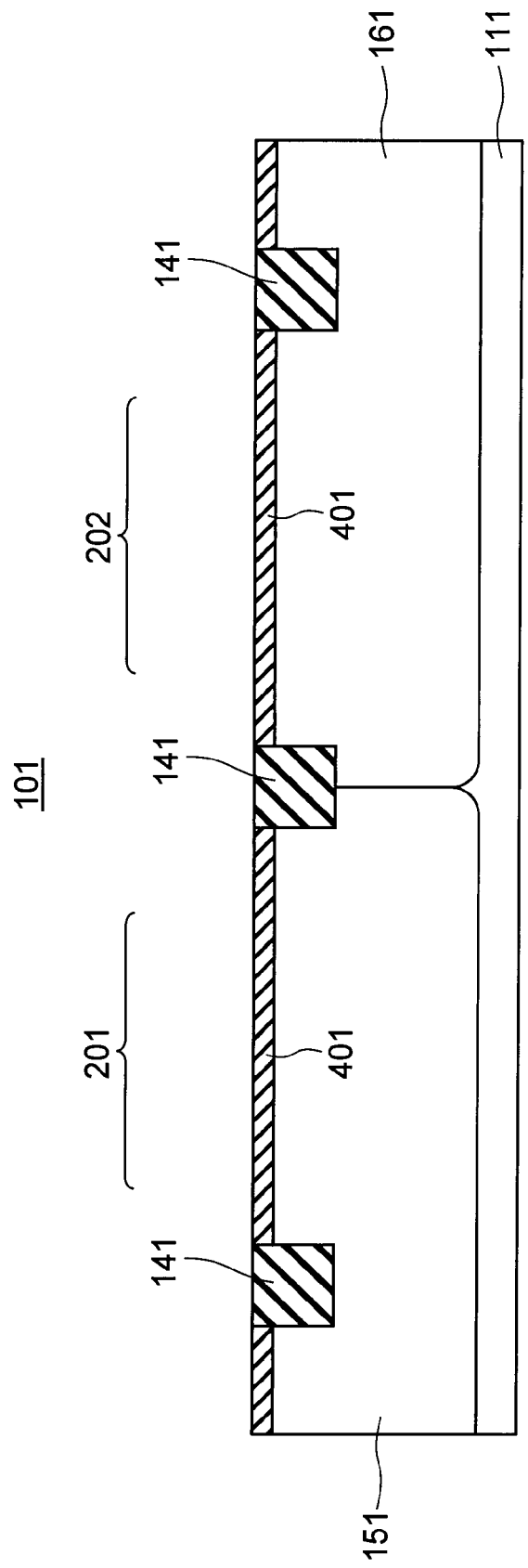
FIGS. 3 to 10 are schematic views illustrating procedures according to a method of manufacturing the semiconductor device of the first embodiment.

First, the isolation layers 141 of STI structures are formed on the surface of the silicon substrate 111 by a conventional technique (FIG. 3). Further, the P-type diffusion layer 151 and the N-type diffusion layer 161 are formed in the silicon substrate 111 by a conventional technique (FIG. 3). Further, a sacrifice oxide film 401 is formed on the surfaces of the P-type diffusion layer 151 and the N-type diffusion layer 161 by a conventional technique (FIG. 3).

Figure 4:
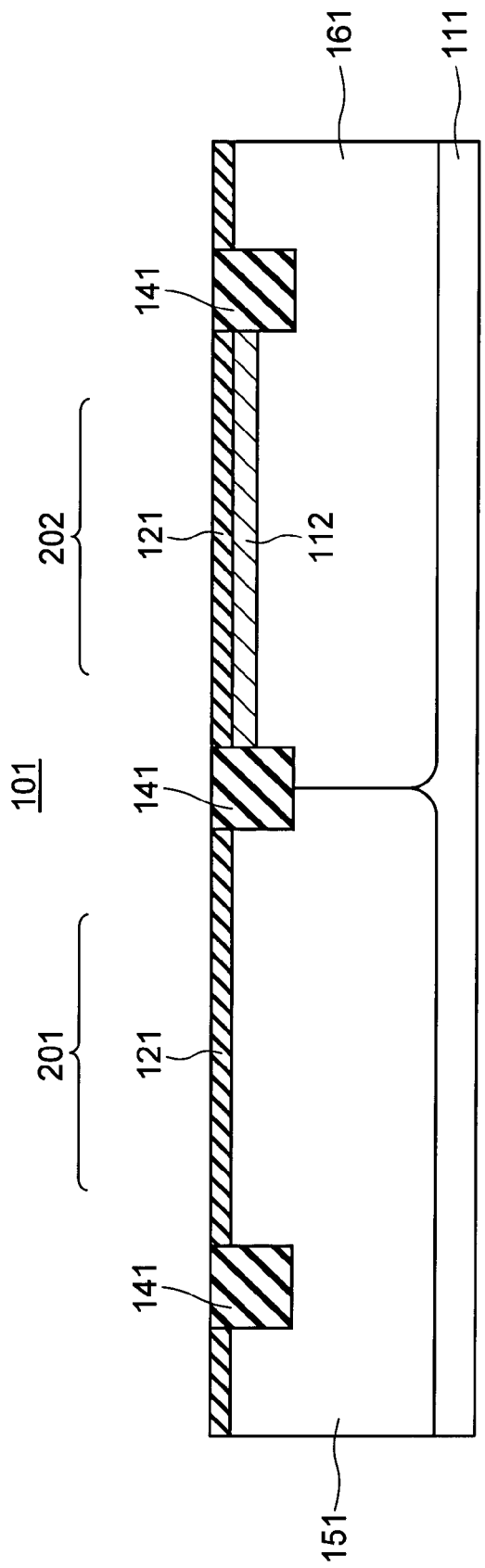

Next, by using a resist as a mask, the sacrifice oxide film 401 on the N-type diffusion layer 161 is removed by using an NH$_4$F aqueous solution or a diluted hydrofluoric acid. Next, the SiGe layer 112 is selectively and epitaxially grown on the surface of the N-type diffusion layer 161 (FIG. 4). By doing so, the channel SiGe layer 112 is formed on the substrate 111 in the PMOS region 202. Next, Si is deposited on the substrate 111.

Next, the sacrifice oxide film 401 on the P-type diffusion layer 151 is removed by using an NH$_4$F aqueous solution or a diluted hydrofluoric acid. Then, a chemical SiO$_2$ film 121 is formed on the P-type diffusion layer 151 and the N-type diffusion layer 161 (FIG. 4). As a result, the SiO$_2$ film 121 is formed on the substrate 111 in the NMOS region 201 and the PMOS region 202. In the NMOS region 201, the SiO$_2$ film 121 is formed directly on the substrate 111. In the PMOS region 202, the SiO$_2$ film 121 is formed on the substrate 111 via the channel SiGe layer 112.

Figure 5:
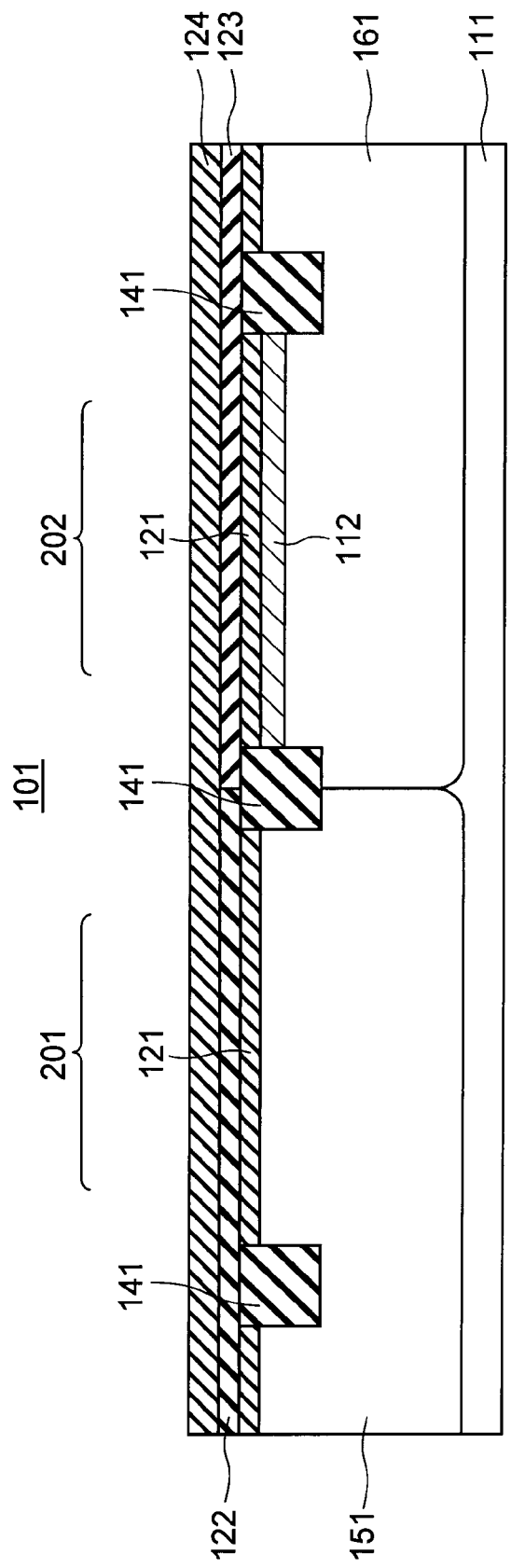

Next, the Al$_2$O$_3$ film 123 is deposited on the entire surface by ALD (Atomic Layer Deposition) or PVD (Physical Vapor Deposition). Next, by using a resist as a mask, the Al$_2$O$_3$ film 123 on the P-type diffusion layer 151 is removed (FIG. 5). As a result, the Al$_2$O$_3$ film 123 is formed on the SiO$_2$ film 121 in the PMOS region 202. Next, the resist is removed.

Next, the La$_2$O$_3$ film 122 is deposited on the entire surface by PVD. Next, by using a resist as a mask, the La$_2$O$_3$ film 122 on the N-type diffusion layer 161 is removed (FIG. 5). As a result, the La$_2$O$_3$ film 122 is formed on the SiO$_2$ film 121 in the NMOS region 201. Next, the resist is removed.

Next, an HfSiO film (hafnium silicon oxide film) of approximately 1.5 to 3.0 nm in thickness is deposited on the entire surface by MOCVD (Metal Organic Chemical Vapor Deposition). After subjected to processing in a nitrogen plasma atmosphere, the substrate 111 is subjected to a heat treatment. As a result, the HfSiO film is turned into the HfSiON film 124 (FIG. 5). In this manner, the HfSiON film 124 is formed on the La$_2$O$_3$ film 122 and the Al$_2$O$_3$ film 123 in the NMOS region 201 and the PMOS region 202.

Figure 6:
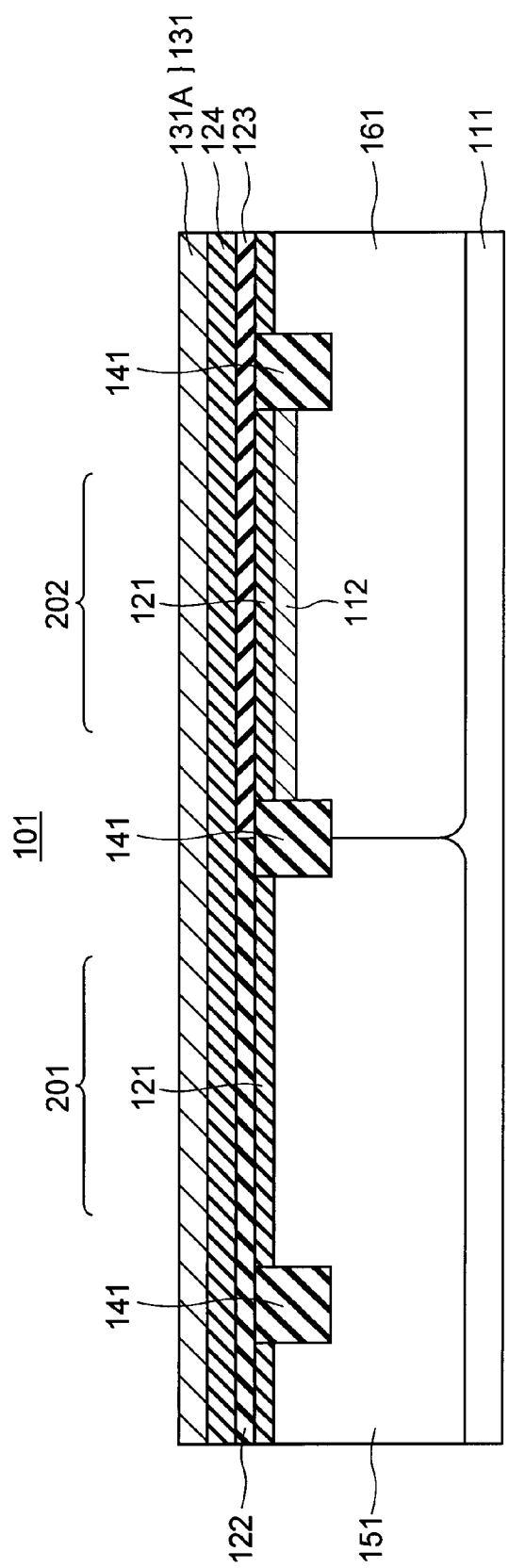

Next, a first TiN film 131A is deposited on the entire surface by PVD (FIG. 6). As a result, the first TiN film 131A is deposited on the HfSiON film 124 in the NMOS region 201 and the PMOS region 202. The first TiN film 131A is an example of a first conductive film that forms the first gate electrode layer. In the first TiN film 131A, the composition ratio between Ti and N is Ti:N=4:6, for example.

Figure 7:
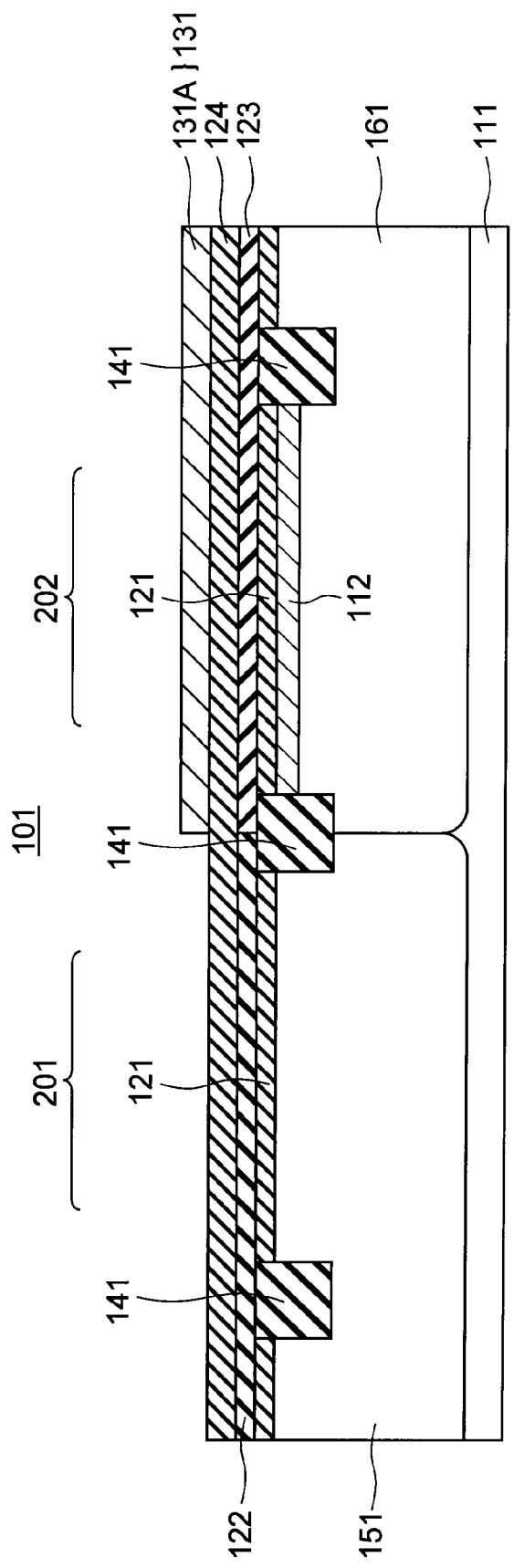

Next, by using a resist as a mask, the first TiN film 131A above the P-type diffusion layer 151 is removed by etching (FIG. 7). As a result, the first TiN film 131A on the HfSiON film 124 in the NMOS region 201 is removed.

Figure 8:
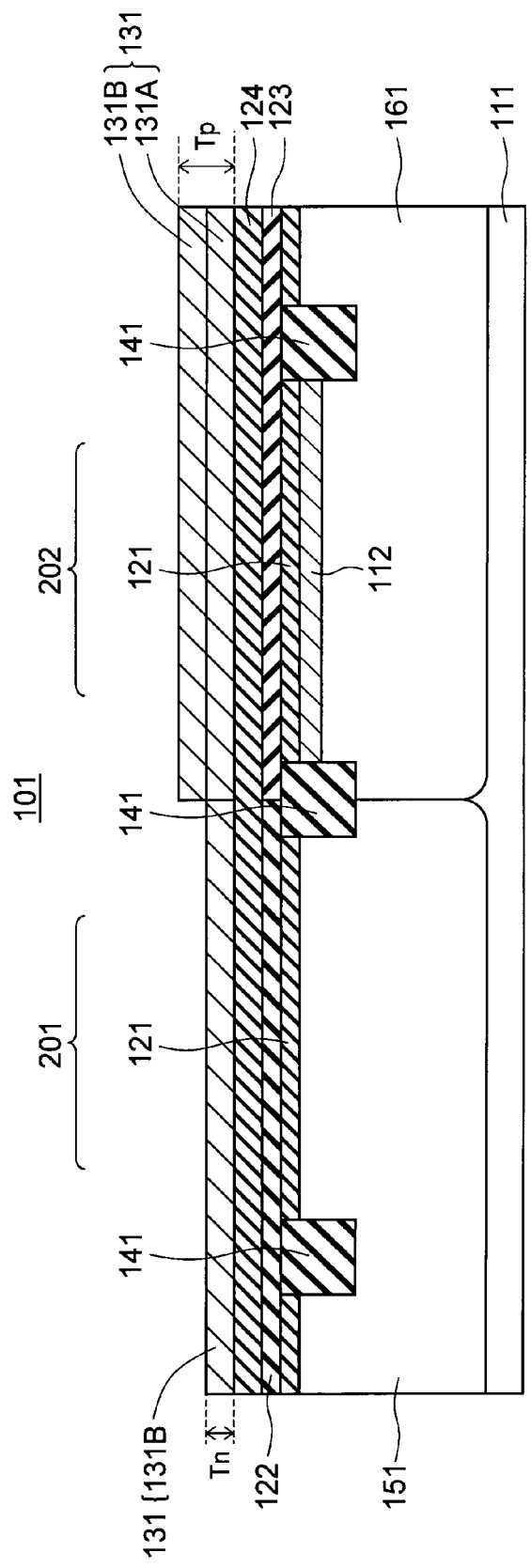

Next, a second TiN film 131B is deposited on the entire surface by PVD (FIG. 8). As a result, the second TiN film 131B is deposited on the HfSiON film 124 and the first TiN film 131A in the NMOS region 201 and the PMOS region 202. The second TiN film 131B is an example of a second conductive film that forms the first gate electrode layer. In the second TiN film 131B, the composition ratio between Ti and N is Ti:N=4:6, for example.

Through the procedures of FIGS. 6 to 8, the TiN film 131 including the first TiN film 131A and the second TiN film 131B is formed. Through the procedures of FIGS. 6 to 8, the thickness (Tp) of the TiN film 131 in the PMOS region 202 is set greater than the thickness (Tn) of the TiN film 131 in the NMOS region 201.

Figure 9:
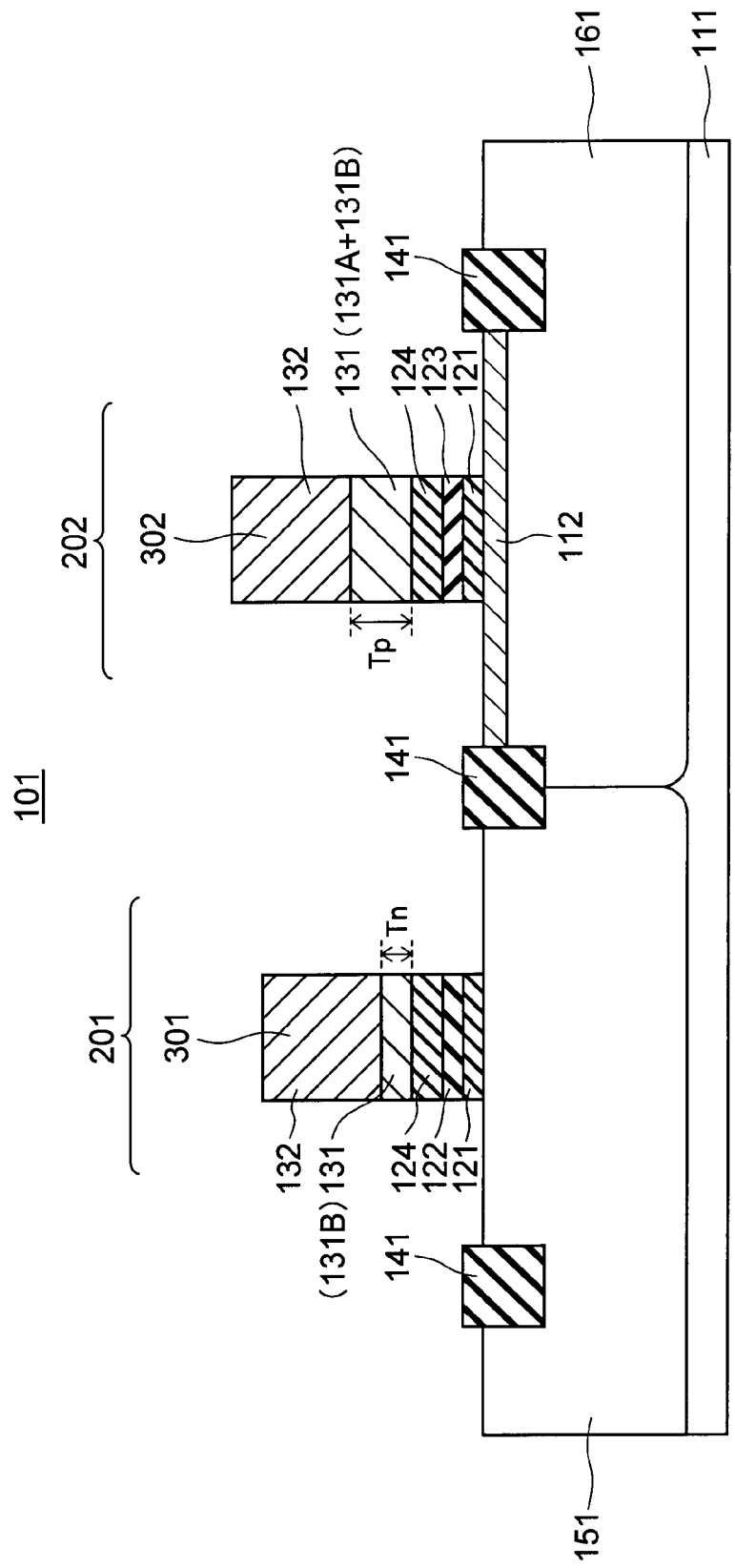

Next, the polysilicon film 132 is deposited on the entire surface (FIG. 9). As a result, the polysilicon film 132 is deposited on the TiN film 131 in the NMOS region 201 and the PMOS region 202.

Next, by using a hard mask, the polysilicon film 132 and the TiN film 131 are etched by RIE (Reactive Ion Etching) to etch the HfSiON film 124, the Al$_2$O$_3$ film 123, the La$_2$O$_3$ film 122, and the SiO$_2$ film 121 (FIG. 9). As a result, the gate electrode that includes the TiN film 131 (131B) and the polysilicon film 132 is formed for the NMOSFET 301, and the gate electrode that includes the TiN film 131 (131A and 131B) and the polysilicon film 132 is formed for the PMOSFET 302.

Figure 10:
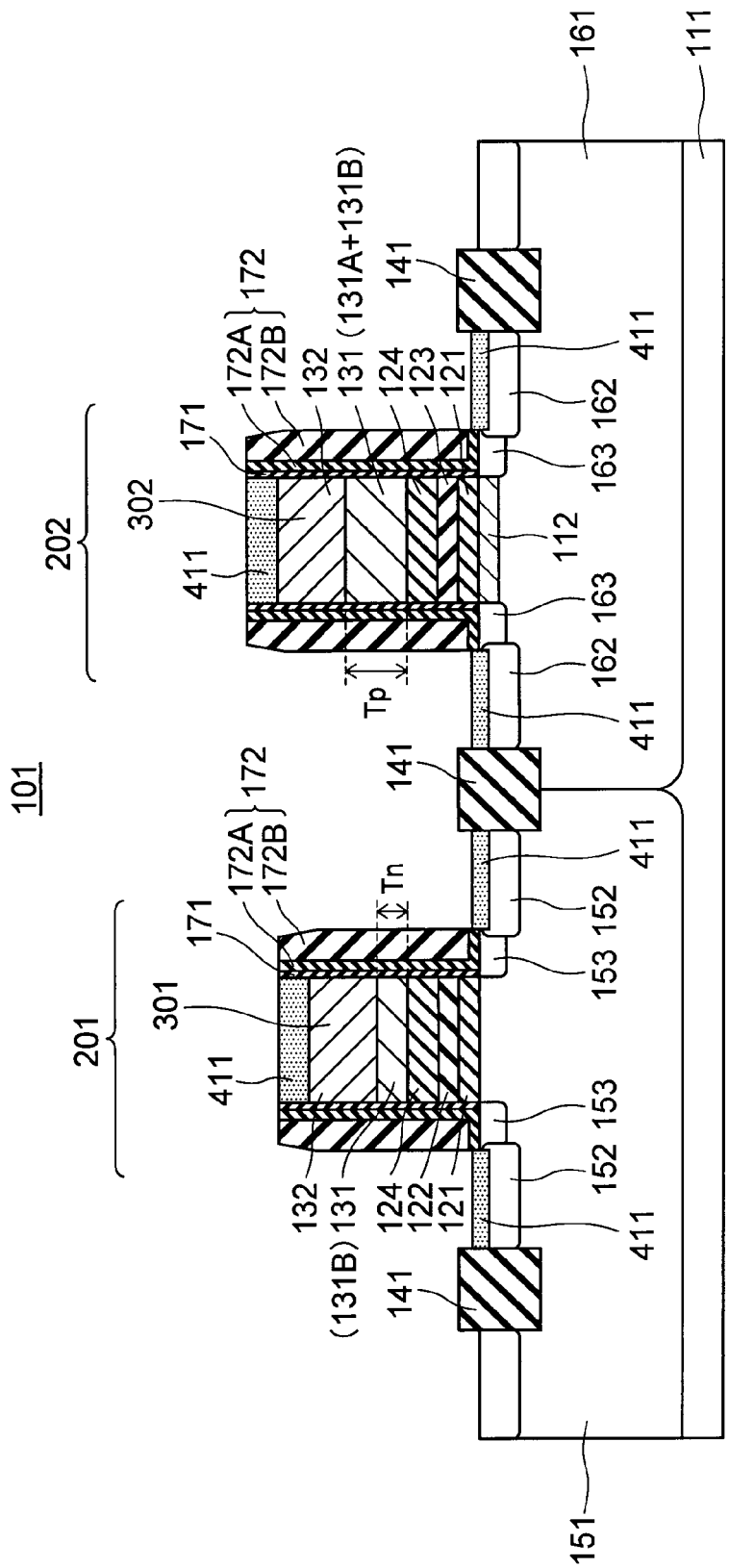

Next, a silicon oxide film or a silicon nitride film is deposited on the entire surface by CVD, and RIE is performed on the silicon oxide film or the silicon nitride film. As a result, the offset spacers 171 are formed on the sidewalls of the NMOSFET 301 and the PMOSFET 302 (FIG. 10).

Next, a silicon oxide film or a silicon nitride film is deposited on the entire surface by CVD, and RIE is performed on the silicon oxide film or the silicon nitride film. As a result, sidewall spacers are formed on the sidewalls of the NMOSFET 301 and the PMOSFET 302 via the offset spacers 171.

Next, by using a resist mask, B (boron) is implanted into the N-type diffusion layer 161. Next, by using a resist mask, P (phosphorus) and As (arsenic) are implanted into the P-type diffusion layer 151. Next, a heat treatment is performed on the substrate 111. As a result, the N-type source and drain diffusion layers 152 sandwiching the NMOSFET 301 are formed on the surface of the P-type diffusion layer 151, and the P-type source and drain diffusion layers 162 sandwiching the PMOSFET 302 are formed on the surface of the N-type diffusion layer 161 (FIG. 10). Next, the sidewall spacers are removed.

Next, by a resist mask, B (boron) is implanted into the N-type diffusion layer 161. Next, by using a resist mask, P (phosphorus) and As (arsenic) are implanted into the P-type diffusion layer 151. Next, a heat treatment is performed on the substrate 111. As a result, the N-type extension diffusion layers 153 sandwiching the NMOSFET 301 are formed on the surface of the P-type diffusion layer 151, and the P-type extension diffusion layers 163 sandwiching the PMOSFET 302 are formed on the surface of the N-type diffusion layer 161 (FIG. 10).

Next, a silicon oxide film 172A and a silicon nitride film 172B are deposited on the entire surface by CVD, and RIE is performed on the silicon oxide film 172A and the silicon nitride film 172B. As a result, the sidewall spacers 172 including the silicon oxide film 172A and the silicon nitride film 172B are formed on the sidewalls of the NMOSFET 301 and the PMOSFET 302 via the offset spacers 171 (FIG. 10).

Next, silicide films 411 are formed on the surfaces of the polysilicon film 132, the N-type source and drain diffusion layers 152, and the P-type source and drain diffusion layers 162 in a self-aligning manner (FIG. 10).

Then, interlayer insulation films, contact holes, contact plugs, interconnect layers and the like are formed by conventional techniques. In this manner, the semiconductor device 101 including the NMOSFET 301 formed in the NMOS region 201 and the PMOSFET 302 formed in the PMOS region 202 is manufactured.

As described above, the EWF of the TiN film 131 is affected by the heating processes performed during the manufacture. Also, as described above, the excess nitrogen in the TiN film 131 diffuses into the HfSiON film 124 due to the heating processes performed during the manufacture. According to the manufacture method of this embodiment, the heating processes are performed for the substrate 111 when the source and drain diffusion layers 152 and 162 are formed, and when the extension diffusion layers 153 and 163 are formed, in the procedure shown in FIG. 10. Those heating processes are examples of the heating processes that affect the EWFs and the diffusion of excess nitrogen, and are also examples of processes to be performed to introduce the excess nitrogen from the TiN film 131 (131A and 131B) into the HfSiON film 124.

In this embodiment, the extension diffusion layers 153 and 163 are formed after the source and drain diffusion layers 152 and 162 are formed. However, the source and drain diffusion layers 152 and 162 may be formed after the extension diffusion layers 153 and 163 are formed. In such a case, the offset spacers 171, the extension diffusion layers 153 and 163, the sidewall spacers 172, and the source and drain diffusion layers 152 and 162 are formed in this order.

The first TiN film (the first conductive film) 131A and the second TiN film (the second conductive film) 131B are now described.

In this embodiment, the composition ratio between Ti and N in the first TiN film 131A is the same as the composition ratio between Ti and N in the second TiN film 131B. However, those composition ratios may differ from each other. In such a case, the volume density of the excess nitrogen in the first TiN film 131A differs from the volume density of the excess nitrogen in the second TiN film 131B.

In the above case, it is desirable that the volume density of the excess nitrogen in the first TiN film 131A is made higher than the volume density of the excess nitrogen in the second TiN film 131B. The reason for this is that setting a large density difference ΔN with a relatively small thickness difference ΔT becomes possible with that arrangement.

The first and second conductive films may be of a different type from each other. For example, the first conductive film may be a TiN film, and the second conductive film may be a metal nitride film other than the TiN film. In such a case, it is also preferable that the volume density of the excess nitrogen in the first conductive film is made higher than the volume density of the excess nitrogen in the second conductive film.

As described above, in this embodiment, the thickness of the TiN film 131 in the PMOS region 202 is greater than the thickness of the TiN 131 in the NMOS region 201. With this arrangement, the NMOSFET 301 and the PMOSFET 302 can both have low threshold voltages.

In the following, a semiconductor device 101 of a second embodiment is described. The second embodiment is a modification of the first embodiment, and aspects of the second embodiment that differ from the first embodiment are mainly described below.

Second Embodiment

Figure 11:
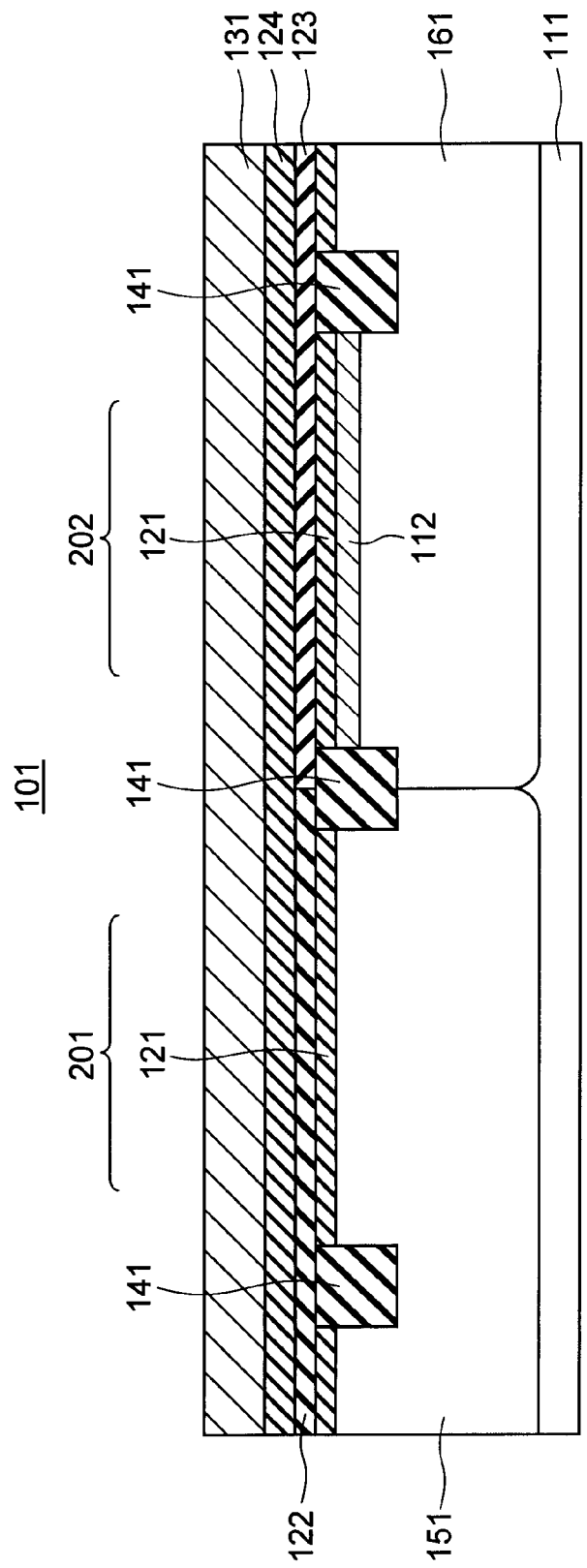
FIGS. 11 and 12 are schematic views illustrating procedures according to a method of manufacturing a semiconductor device of a second embodiment.
Figure 12:
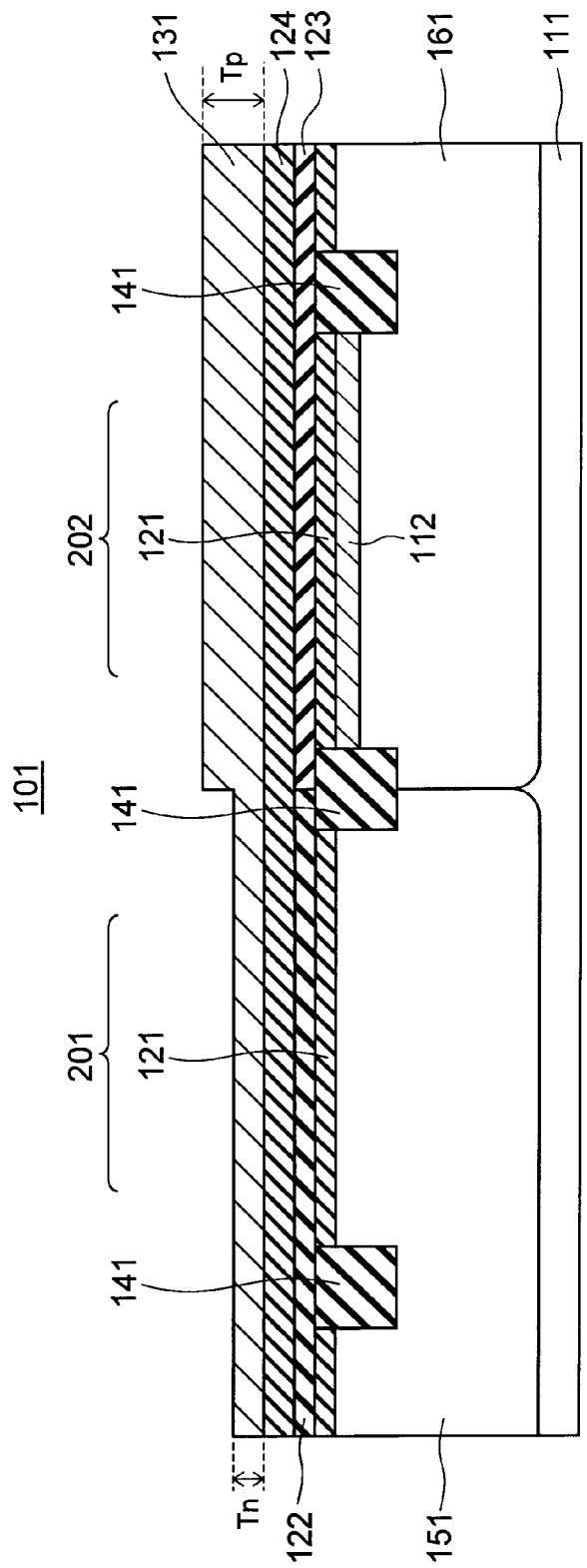

FIGS. 11 and 12 are schematic views illustrating procedures according to a method of manufacturing the semiconductor device 101 of the second embodiment. According to the manufacture method of the second embodiment, the semiconductor device 101 shown in FIG. 1 is manufactured similar to the first embodiment. However, the manufacture method of the second embodiment partially differs from the manufacture method of the first embodiment.

In the second embodiment, the procedures illustrated in FIGS. 3 to 5 are first carried out as in the same manner as in the first embodiment.

Next, a TiN film 131 is deposited on the entire surface by PVD (FIG. 11). As a result, the TiN film 131 is deposited on the HfSiON film 124 in the NMOS region 201 and the PMOS region 202. The composition ratio between Ti and N in the TiN film 131 is Ti:N=4:6, for example.

Next, wet etching or dry etching is performed on the TiN film 131 on the P-type diffusion layer 151 (FIG. 12). As a result, the TiN film 131 in the NMOS region 201 becomes thinner, and the thickness (Tp) of the TiN film 131 in the PMOS region 202 becomes greater than the thickness (Tn) of the TiN film 131 in the NMOS region 201.

Thereafter, the procedures illustrated in FIGS. 9 and 10 are carried out in the same manner as in the first embodiment. In this manner, the semiconductor device 101 that has the NMOSFET 301 formed in the NMOS region 201 and the PMOSFET 302 formed in the PMOS region 202 is manufactured. The manufacture method of the second embodiment has an advantage over the manufacture method of the first embodiment, involving the smaller number of manufacturing procedures than that in the first embodiment.

In the first embodiment, the total thickness of the first TiN film 131A and the second TiN film 131B defines the thickness Tp. In the second embodiment, on the other hand, the thickness of the TiN film 131 deposited in the procedure illustrated in FIG. 11 defines the thickness Tp. Accordingly, if the same semiconductor device 101 are manufactured in the first embodiment and the second embodiment, the thickness of the TiN film 131 deposited in the procedure illustrated in FIG. 11 needs to be greater than the thickness of the first TiN film 131A deposited in the procedure illustrated in FIG. 6.

Figure 13:
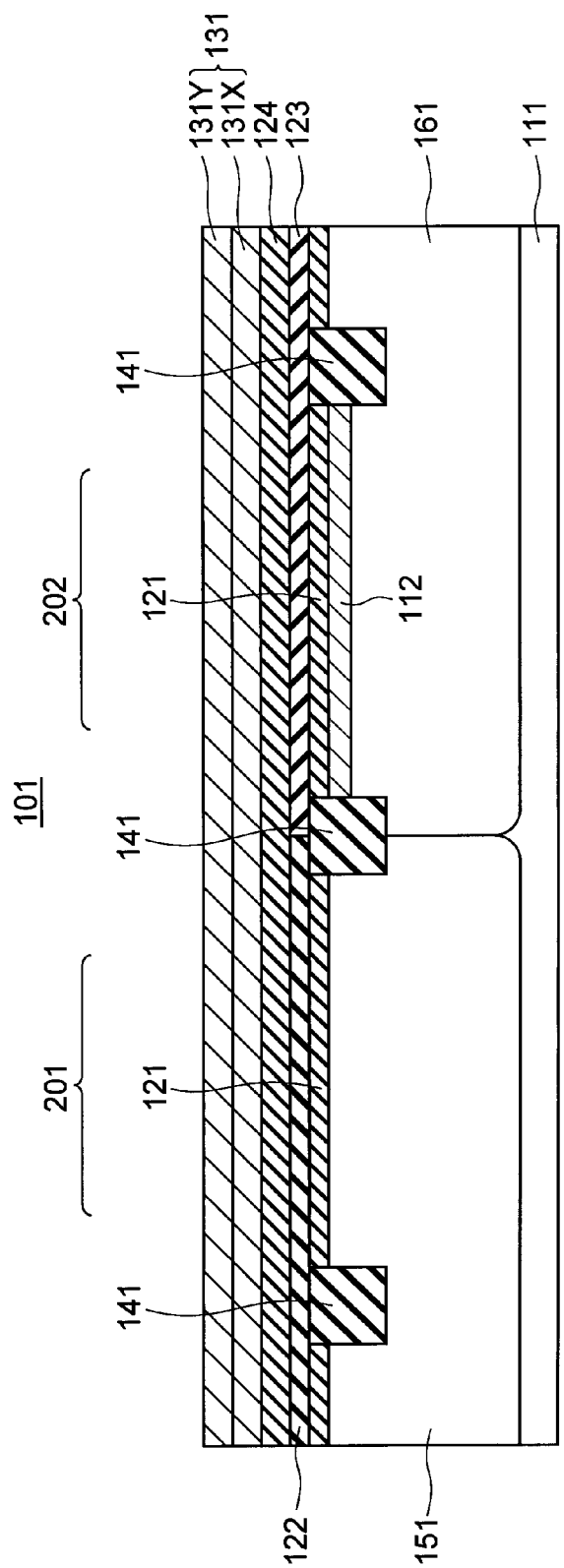
FIGS. 13 and 14 are schematic views illustrating procedures according to a modification of the method of manufacturing the semiconductor device of the second embodiment.
Figure 14:
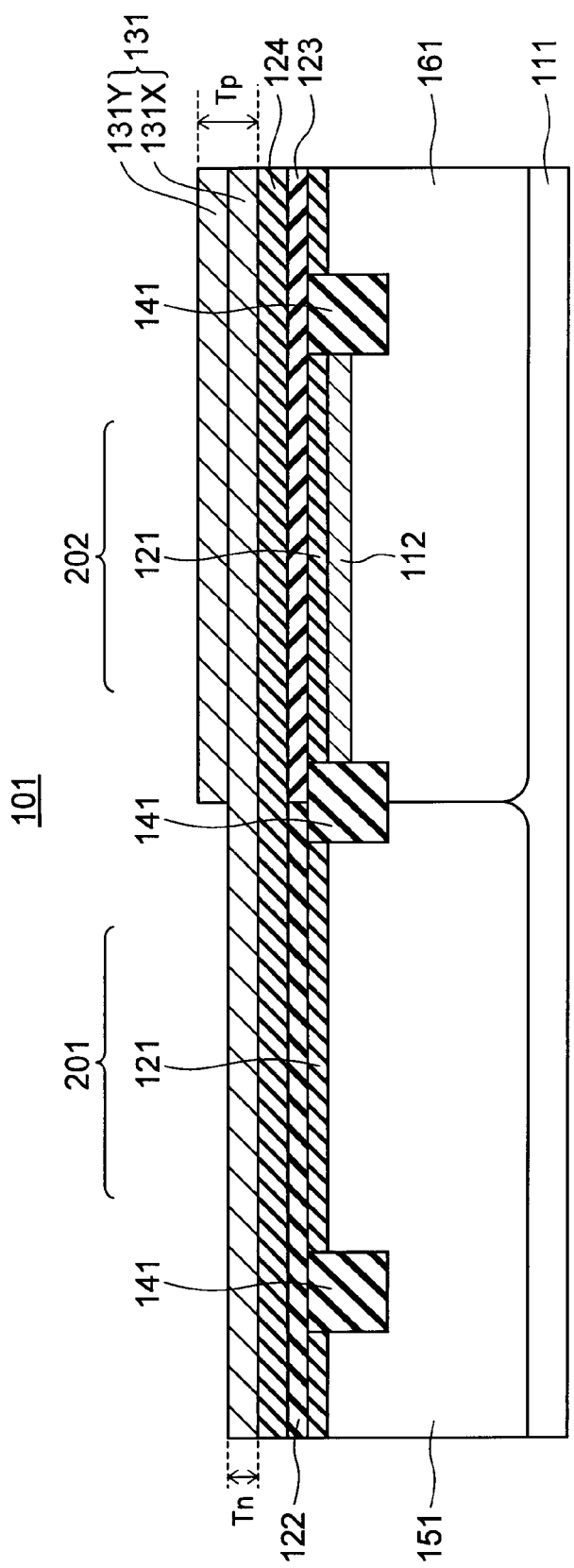

The procedures illustrated in FIGS. 11 and 12 may be replaced with those illustrated in FIGS. 13 and 14. FIGS. 13 and 14 are schematic views illustrating procedures according to a modification of the method of manufacturing the semiconductor 101 of the second embodiment.

In FIG. 13, a first TiN film (first conductive film) 131X and a second TiN film (second conductive film) 131Y are deposited on the entire surface in this order by PVD. As a result, the first and second TiN films 131X and 131Y are deposited on the HfSiON film 124 in the NMOS region 201 and the PMOS region 202, and a TiN film 131 including the first and second TiN films 131X and 131Y is formed. In the first and second TiN films 131X and 131Y, the composition ratio between Ti and N is Ti:N=4:6, for example.

In FIG. 14, wet etching or dry etching is performed to remove the second TiN film 131Y above the P-type diffusion layer 151. As a result, the TiN film 131 in the NMOS region 201 becomes thinner, and the thickness (Tp) of the TiN film 131 in the PMOS region 202 becomes greater than the thickness (Tn) of the TiN film 131 in the NMOS region 201.

The composition ratio between Ti and N in the first TiN film 131X may differ from the composition ratio between Ti and N in the second TiN film 131Y. This is same as the first embodiment. In such a case, the volume density of the excess nitrogen in the second TiN film 131Y should preferably be made higher than the volume density of the excess nitrogen in the first TiN film 131X. The reason for this is that setting a large density difference ΔN with a relatively small thickness difference ΔT becomes possible with that arrangement.

Further, the first and second conductive films may be of a different type from each other. This is same the first embodiment. In such a case, it is also preferable that the volume density of the excess nitrogen in the second conductive film is made higher than the volume density of the excess nitrogen in the first conductive film.

As described above, in this embodiment, the thickness of the TiN film 131 in the PMOS region 202 is greater than the thickness of the TiN 131 in the NMOS region 201 as in the first embodiment. With this arrangement, the NMOSFET 301 and the PMOSFET 302 can both have low threshold voltages as in the first embodiment.

As described so far, the embodiments of the present invention can provide a semiconductor device in which the N-type transistor and the P-type transistor both have low threshold voltages, and can provide a method of manufacturing such a semiconductor device.

Although examples of specific aspects of the present invention have been described by way of the first and second embodiments, the present invention is not limited to those embodiments.

The invention claimed is:

1. A method of manufacturing a semiconductor device, for forming an N-type transistor in a first region on a substrate, and forming a P-type transistor in a second region on the substrate, the method comprising:
    forming a first gate insulation film containing silicon, on the substrate in the first and second regions;
    forming a second gate insulation film containing first metal and oxygen, on the first gate insulation film in the first region;
    forming a third gate insulation film containing second metal different from the first metal and oxygen, on the first gate insulation film in the second region;
    forming a fourth gate insulation film containing hafnium, on the second and third gate insulation films in the first and second regions;
    depositing a first conductive film containing metal and nitrogen, on the fourth gate insulation film in the first and second regions;
    removing the first conductive film on the fourth gate insulation film in the first region;
    depositing a second conductive film containing metal and nitrogen, on the fourth gate insulation film and the first conductive film in the first and second regions;
    introducing excess nitrogen from the first and second conductive films into the fourth gate insulation film; and
    etching the first and second conductive films in the first and second regions to form a gate electrode for the N-type transistor including the second conductive film, and a gate electrode for the P-type transistor including the first and second conductive films.

2. The method according to claim 1, wherein
a volume density of the excess nitrogen in the first conductive film is higher than a volume density of the excess nitrogen in the second conductive film.

3. The method according to claim 1, wherein
an epitaxial semiconductor layer is formed between the substrate and the first gate insulation film in the second region.

4. The method according to claim 1, wherein
a gate electrode layer containing silicon is deposited on the first and second conductive films in the first and second regions,
the gate electrode for the N-type transistor includes the second conductive film and the gate electrode layer, and
the gate electrode for the P-type transistor includes the first and second conductive films and the gate electrode layer.

5. The method according to claim 1, wherein
the second and third gate insulation films are a lanthanum oxide film and an aluminum oxide film, respectively.

6. The method according to claim 1, wherein
a difference between a total thickness of the first and second conductive films formed in the second region and a thickness of the second conductive film formed in the first region is equal to or greater than 2 nm.

7. The method according to claim 1, wherein
a difference between a total thickness of the first and second conductive films formed in the second region and a thickness of the second conductive film formed in the first region is equal to or smaller than 10 nm.

8. The method according to claim 1, wherein
a difference between an area density of the excess nitrogen in the first and second conductive films formed in the second region and an area density of the excess nitrogen in the second conductive film formed in the first region is in the range of $1 \times 10^{12}$ cm$^{-2}$ to $1 \times 10^{13}$ cm$^{-2}$.

9. The method according to claim 1, wherein
a composition ratio between the metal and nitrogen in the first conductive film is substantially the same as a composition ratio between the metal and nitrogen in the second conductive film.

10. The method according to claim 1, wherein
a composition ratio between the metal and nitrogen in the first conductive film is different from a composition ratio between the metal and nitrogen in the second conductive film.

11. The method according to claim 1, wherein
the excess nitrogen in the first and second conductive films is introduced into the fourth gate insulation film, through a heating process performed to form source and drain diffusion layers and extension diffusion layers for the N-type and P-type transistors.

12. A method of manufacturing a semiconductor device, for forming an N-type transistor in a first region on a substrate, and forming a P-type transistor in a second region on the substrate, the method comprising:

forming a first gate insulation film containing silicon, on the substrate in the first and second regions;

forming a second gate insulation film containing first metal and oxygen, on the first gate insulation film in the first region;

forming a third gate insulation film containing second metal different from the first metal and oxygen, on the first gate insulation film in the second region;

forming a fourth gate insulation film containing hafnium, on the second and third gate insulation films in the first and second regions;

depositing a gate electrode layer containing metal and nitrogen, on the fourth gate insulation film in the first and second regions;

etching the gate electrode layer in the first region to make a thickness of the gate electrode layer in the second region be greater than a thickness of the gate electrode layer in the first region;

introducing excess nitrogen from the gate electrode layer into the fourth gate insulation film; and etching the gate electrode layer in the first and second regions to form a gate electrode for the N-type transistor including the gate electrode layer, and a gate electrode for the P-type transistor including the gate electrode layer.

13. The method according to claim 12, wherein
a difference between a thickness of the gate electrode layer formed in the second region and a thickness of the gate electrode layer formed in the first region is equal to or greater than 2 nm.

14. The method according to claim 12, wherein
a difference between a thickness of the gate electrode layer formed in the second region and a thickness of the gate electrode layer formed in the first region is equal to or smaller than 10 nm.

15. The method according to claim 12, wherein
a difference between an area density of the excess nitrogen in the gate electrode layer formed in the second region and an area density of the excess nitrogen in the gate electrode layer formed in the first region is in the range of $1 \times 10^{12}$ cm$^{-2}$ to $1 \times 10^{13}$ cm$^{-2}$.

* * * * *